(12) United States Patent
Lewis et al.

(10) Patent No.: US 8,110,898 B2
(45) Date of Patent: Feb. 7, 2012

(54) POLYMER-EMBEDDED SEMICONDUCTOR ROD ARRAYS

(75) Inventors: Nathan S. Lewis, La Canada, CA (US); Katherine E. Plass, Lancaster, PA (US); Joshua M. Spurgeon, Pasadena, CA (US); Harry A. Atwater, S. Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 281 days.

(21) Appl. No.: 12/176,065

(22) Filed: Jul. 18, 2008

(65) Prior Publication Data

US 2009/0057839 A1 Mar. 5, 2009

Related U.S. Application Data

(60) Provisional application No. 60/966,432, filed on Aug. 28, 2007, provisional application No. 61/127,437, filed on May 13, 2008.

(51) Int. Cl.
*H01L 29/06* (2006.01)

(52) U.S. Cl. .............. 257/618; 257/619; 257/9; 257/40; 257/E29.005; 438/478

(58) Field of Classification Search .................. 257/618, 257/619, 9, 40, E29.005; 438/478
See application file for complete search history.

(56) References Cited

U.S. PATENT DOCUMENTS

| | | | |
|---|---|---|---|
| 5,314,569 A | 5/1994 | Pribat | |
| 5,336,558 A | 8/1994 | Debe | |
| 5,352,651 A | 10/1994 | Debe | |
| 5,976,957 A | 11/1999 | Westwater et al. | |
| 6,306,734 B1 | 10/2001 | Givargizov | |
| 6,649,824 B1 | 11/2003 | Den | |
| 7,057,881 B2 | 6/2006 | Chew et al. | |
| 7,105,428 B2 | 9/2006 | Pan et al. | |
| 7,109,517 B2 | 9/2006 | Zaidi | |
| 7,116,546 B2 | 10/2006 | Chew | |
| 7,238,594 B2 | 7/2007 | Fenash et al. | |
| 7,253,017 B1 * | 8/2007 | Roscheisen et al. | ............ 438/57 |
| 7,253,442 B2 | 8/2007 | Huang | |
| 7,309,620 B2 | 12/2007 | Fonash et al. | |

(Continued)

FOREIGN PATENT DOCUMENTS

CN 1669920 A 9/2005

(Continued)

OTHER PUBLICATIONS

PCT Search Report for PCT/US2008/070495 in the name of California Institute of Technology filed on Jul. 18, 2008.

(Continued)

*Primary Examiner* — Tu-Tu Ho
(74) *Attorney, Agent, or Firm* — Joseph R. Baker, Jr.; Gavrilovich Dodd & Lindsey LLP

(57) ABSTRACT

A structure consisting of well-ordered semiconductor structures embedded in a binder material which maintains the ordering and orientation of the semiconductor structures. Methods for forming such a structure include forming the semiconductor structures on a substrate, casting a binder material onto the substrate to embed the semiconductor structures in the binder material, and separating the binder material from the substrate at the substrate. These methods provide for the retention of the orientation and order of highly ordered semiconductor structures in the separated binder material.

10 Claims, 13 Drawing Sheets

U.S. PATENT DOCUMENTS

| | | | |
|---|---|---|---|
| 7,335,259 | B2 | 2/2008 | Hanrath et al. |
| 7,560,366 | B1 | 7/2009 | Romano et al. |
| 7,666,708 | B2 | 2/2010 | Lieber et al. |
| 2002/0172820 | A1 | 11/2002 | Majumdar et al. |
| 2005/0253138 | A1 | 11/2005 | Choi et al. |
| 2005/0279274 | A1 | 12/2005 | Niu et al. |
| 2006/0118791 | A1 | 6/2006 | Leu |
| 2006/0207647 | A1 | 9/2006 | Tsakalakos et al. |
| 2007/0122313 | A1 | 5/2007 | Li et al. |
| 2007/0166899 | A1 | 7/2007 | Yao et al. |
| 2007/0278476 | A1 | 12/2007 | Black |
| 2008/0047604 | A1 | 2/2008 | Korevaar et al. |
| 2008/0075954 | A1 | 3/2008 | Wardle et al. |
| 2008/0110486 | A1 | 5/2008 | Tsakalakos et al. |
| 2008/0134089 | A1 | 6/2008 | Tsakalakos et al. |
| 2008/0169017 | A1 | 7/2008 | Korevaar et al. |
| 2008/0315430 | A1 | 12/2008 | Weber et al. |
| 2009/0020150 | A1 | 1/2009 | Atwater et al. |
| 2009/0020853 | A1 | 1/2009 | Kayes et al. |
| 2009/0050204 | A1 | 2/2009 | Habib |
| 2009/0057839 | A1 | 3/2009 | Lewis et al. |
| 2009/0127540 | A1 | 5/2009 | Taylor |
| 2009/0152527 | A1 | 6/2009 | Lee et al. |
| 2009/0266411 | A1 | 10/2009 | Habib et al. |

FOREIGN PATENT DOCUMENTS

| | | |
|---|---|---|
| CN | 1808688 A | 7/2006 |
| JP | 11-214720 | 8/1999 |
| JP | 2005-194609 | 7/2005 |
| JP | 2005-310388 | 11/2005 |
| KR | 10-2007-18457 | 2/2007 |
| WO | 03/005450 A2 | 1/2003 |
| WO | 2006/138671 | 12/2006 |
| WO | 2008/135905 A2 | 11/2008 |

OTHER PUBLICATIONS

PCT Written Opinion for PCT/US2008/070495 in the name of California Institute of Technology filed on Jul. 18, 2008.

PCT Search Report for PCT/US2008/070523 in the name of California Institute of Technology filed on Jul. 18, 2008.

PCT Written Opinion for PCT/US2008/070523 in the name of California Institute of Technology filed on Jul. 18, 2008.

PCT Search Report for PCT/US2008/070509 in the name of California Institute of Technology filed on Jul. 18, 2008.

PCT Written Opinion for PCT/US2008/070509 in the name of California Institute of Technology filed on Jul. 18, 2008.

PCT Search Report for PCT/US2008/070518 in the name of California Institute of Technology filed on Jul. 18, 2008.

PCT Written Opinion for PCT/US2008/070518 in the name of California Institute of Technology filed on Jul. 18, 2008.

Office Action issued by USPTO for U.S. Appl. No. 12/176,100 dated Jan. 6, 2010.

Sze, S. M. *Physics of Semiconductor Devices*, 2 ed.; John Wiley & Sons, New York, 1981.

Kayes, B. M.; Atwater, H. A.; Lewis, N. S. *J. Appl. Phys.* 2005, 97, 114302.

Fan, H. J.; Werner, P.; Zacharias, M. *Small* 2006, 2, 700-717.

Lombardi, I.; Hochbaum, A. I.; Yang, P.; Carraro, C.; Maboudian, R. *Chem. Mater.* 2006, 18, 988-991.

Huang, Z. P.; Fang, H.; Zhu, J. *Adv. Mater.* 2007, 19, 744-748.

Peng, K.; Xu, Y.; Wu, Y.; Yan, Y.; Lee, S.-T.; Zhu, J. *Small* 2005, 1, 1062-1067.

Huynh, W. U.; Dittmer, J. J.; Alivisatos, A. P. *Science* 2002, 295, 2425-2427.

Lin, Y. T.; Zeng, T. W.; Lai, W. Z.; Chen, C. W.; Lin, Y. Y.; Chang, Y.S.; Su, W. F. *Nanotechnology* 2006, 17, 5781-5785.

Law, M.; Greene, L. E.; Johnson, J. C.; Saykally, R.; Yang, P. D. *Nat. Mater.* 2005, 4, 455-459.

Wagner, R. S.; Ellis, W. C. *Trans. Metallurg. Soc. AIME* 1965, 233, 1053.

Kayes, B. M.; Filler, M. A.; Putnam, M. C.; Kelzenberg, M. D.; Lewis, N. S.; Atwater, H. A. *Appl. Phys. Lett.* 2007, 91, 103110.

Westwater, J.; Gosain, D. P.; Usui, S. *Jpn. J. Appl. Phys. Part 1* 1997, 36, 6204-6209.

Woodruff, J. H.; Ratchford, J. B.; Goldthorpe, I. A.; McIntyre, P. C.; Chidsey, C. E. D. *Nano Lett.* 2007, 7, 1637-1642.

Struthers, J. D. *J. Appl. Phys.* 1956, 27, 1560-1560.

Gibbons, J. F.; Cogan, G. W.; Gronet, C. M.; Lewis, N. S. *Appl. Phys. Lett.* 1984, 45, 1095-1097.

Gronet, C. M.; Lewis, N. S.; Cogan, G. W.; Gibbons, J. F. *Proc. Natl. Acad. Sci. U.S.A.* 1983, 80, 1152-1156.

Rosenbluth, M. L.; Lewis, N. S. *J. Am. Chem. Soc.* 1986, 108, 4689-4695.

Rosenbluth, M. L.; Lewis, N. S. *J. Phys. Chem.* 1989, 93, 3735-3740.

Rosenbluth, M. L.; Lieber, C. M.; Lewis, N. S. *Appl. Phys. Lett.* 1984, 45, 423-425.

Gstrein, F.; Michalak, D. J.; Royea, W. J.; Lewis, N. S. *J. Phys. Chem. B* 2002, 106, 2950-2961.

James R. Maiolo III, Brendan M. Kayes, Michael A. Filler, Morgan C. Putnam, Michael D. Kelzenberg, Harry A. Atwater, and Nathan S. Lewis, J. Am. Chem. Soc. 2007, 129, 12346-12347.

Kayes, B. M.; Richardson, C. E.; Lewis, N. S.; Atwater, H. A. *IEEE Photo. Spec. Conf.* 2005, 55-58.

McCandless, B., and Sites, J. Cadmium Telluride Solar Cells. In *Handbook of Photovoltaic Science and Engineering*, 2003; pp. 617-657.

Jenny, D.; Bube, R. *Phys. Rev.* 1954, 96, 1190-1191.

Harris, L. A.; Wilson, R. H. *Adv. Rev. Mater. Sci.* 1978, 8, 99-134.

Basol, B. *J. Appl. Phys.* 1984, 55, 601-603.

Fulop, G., et al. *Appl. Phys. Lett.* 1982, 40, 327-328.

Bhattacharya, R.; Rajeshwar, K. *J. Electrochem. Soc.* 1984, 131, 2032-2041.

Paulson, P. D.; Mathew, X. *Sol. Energy Mater. Sol. Cells* 2004, 82, 279-290.

Lepiller, C.; Lincot, D. *J. Electrochem. Soc.* 2004, 151, C348-C357.

Kressin, A.; Doan, V.; Klein, J.; Sailor, M. *Chem. Mater.* 1991, 3, 1015-1020.

Basol, B. *Conf. Rec. IEEE Photo. Spec. Conf.* 1990, 588-594.

Klein, J.; Herrick, R.; Palmer, D.; Sailor, M.; Brumlik, C.; Martin, C. *Chem. Mater.* 1993, 5, 902-904.

Basol, B.; Tseng, E.; Rod, R. *Conf. Rec. IEEE Photo. Spec. Conf.* 1982, 805-808.

Xia, Y., et al. *Adv. Mater.* 2003, 15, 353-389.

Law, M.; Goldberger, J.; Yang, P. *Annu. Rev. Mater. Res.* 2004, 34, 83-122.

Gu, Y.; Romankiewicz, J.; David, J.; Lensch, J.; Lauhon, L. *Nano Lett.* 2006, 6, 948-952.

Yu, J.; Chung, S.; Heath, J. *J. Phys. Chem. B* 2000, 104, 11864-11870.

Haick, H.; Hurley, P.; Hochbaum, A.; Yang, P.; Lewis, N. *J. Am. Chem. Soc.* 2006, 128, 8990-8991.

Lauhon, L.; Gudiksen, M.; Wang, D.; Lieber, C. *Nature* 2002, 420, 57-61.

Shimizu, T.; Xie, T.; Nishikawa, J.; Shingubara, S.; Senz, S.; Gosele, U. *Adv. Mater.* 2007, 19, 917-920.

Erts, D., et al. *J. Phys. Chem. B* 2006, 110, 820-826.

Mohan, P.; Motohisa, J.; Fukui, T. *Nanotech.* 2005, 16, 2903-2907.

Fan, H., et al. *J. Cryst. Growth* 2006, 287, 34-38.

Routkevitch, D.; Bigioni, T.; Moskovits, M.; Xu, J. M. *J. Phys. Chem.* 1996, 100, 14037-14047.

Yoonmook, K.; Park, N.; Kim, D. *Appl. Phys. Lett.* 2005, 86, 113101-1 to 113101-3.

James R. Maiolo, III, Harry A. Atwater, and Nathan S. Lewis, J. Phys. Chem. 112, 6194-6201, 2008.

Z. Huang, H. Feng, and J. Zhu, Adv. Mater. (Weinheim, Ger.) 19, 744 (2007).

R. S. Wagner and W. C. Ellis, Appl. Phys. Lett. 4, 89 (1964).

T. Martensson, M. Borgstrom, W. Seifert, B. J. Ohlsson, and L. Samuelson, Nanotechnology 14, 1255 (2003).

J. Westwater, D. P. Gosain, and S. Usui, Jpn. J. Appl. Phys., Part 1 36, 6204 (1997).

T. Kawano, Y. Kato, M. Futagawa, H. Takao, K. Sawada, and M. Ishida, Sens. Actuators, A 97, 709 (2002).

B. M. Kayes, J. M. Spurgeon, T. C. Sadler, N. S. Lewis, and H. A. Atwater, Proceedings of the Fourth IEEE WCPEC, 2006, vol. 1, p. 221.

T. Shimizu, T. Xie, J. Nishikawa, S. Shingybara, S. Senz, and U. Gosele, Adv. Mater. (Weinheim, Ger.) 19, 917 (2007).
B. M. Kayes, N. S. Lewis, and H. A. Atwater, J. Appl. Phys. 97, 114302 2005.
M. J. A. de Dood, Ph.D. thesis, Utrecht University, 2002.
H. J. Fan, P. Werner, and M. Zacharias, Small 2, 700, 2006.
E. I. Givargizov, *Highly Anisotropic crystals* _D. Reidel, Dordrecht, Holland,1987, p. 169.
A. I. Hochbaum, R. Fan, R. He, and P. Yang, Nano Lett. 5, 457, 2005.
I. Lombardi, A. I. Hochbaum, P. Yang, C. Carraro, and R. Maboudian, Chem. Mater. 18, 988, 2006.
V. Schmidt, S. Senz, and U. Gösele, Nano Lett. 5, 931, 2005.
W. M. Bullis, Solid-State Electron. 9, 143, 1966.
C. Jacoboni, C. Canali, G. Ottaviani, and A. Alberigi Quaranta, Solid-State Electron. 20, 77, 1977.
L. J. Guo, Adv. Mater. Weinheim, Ger. 19, 495, 2007.
Y. Yao and S. Fan, Mater. Lett. 61, 177, 2007.
R. S. Wagner and W. C. Ellis, Trans. Metall. Soc. AIME 233, 1053, 1965.
G. B. Haxel, J. B. Hedrick, and G. J. Orris, *Rare Earth Elements—critical Resources for High Technology: US Geological Survey Fact Sheet* 087-02, 2002, p. 3.
D. Struthers, J. Appl. Phys. 27, 1560, 1956.
M. Sze, *Physics of Semiconductor Devices*, 2nd ed. _Wiley, New York, 1981, p. 21.
J. R. Davis, A. Rohatgi, R. H. Hopkins, P. D. Blais, P. Raichoudhury, J. R. McCormick, and H. C. Mollenkopf, IEEE Trans. Electron Devices 27, 677, 1980.
R. H. Hopkins and A. Rohatgi, J. Cryst. Growth 75, 67, 1986.
B.M. Kayes, C.E. Richardson, N. S. Lewis, and H.A. Atwater, IEEE PVSC 2005.
Schetinin, Drozhzhin, Sedykh, Novokreshchenova—Photoconverters Based on Si Whiskers 1978.
Brendan M. Kayes, Michael A. Filler, Morgan C. Putnam, Michael D. Kelzenberg, Nathan S. Lewis, and Harry A. Atwater, Applied Physics Letters 91, 103110 (2007).
Supplementary material for Brendan M. Kayes, Michael A. Filler, Morgan C. Putnam, Michael D. Kelzenberg, Nathan S. Lewis, and Harry A. Atwater, "Growth of vertically aligned Si wire arrays over large areas (>1 cm2) with Au and Cu catalysts", App. Phys. Lett.
Michael D. Kelzenberg, Daniel B. Turner-Evans, Brendan M. Kayes, Michael A. Filler, Morgan C. Putnam, Nathan S. Lewis, and Harry A. Atwater, Nono Letters, vol. 8, No. 2, 710-714, 2008.
B. M. Kayes, H. A. Atwater, and N. S. Lewis, *J. Appl. Phys.* 97 (11), 114302 (2005).
B. M. Kayes, M. A. Filler, M. C. Putnam et al., *Appl. Phys. Lett.* 91, 103110 (2007).
J. R. Maiolo, B. M. Kayes, M. A. Filler et al., *J. Am. Chem. Soc.* 129, 12346 (2007).
M. D. Kelzenberg, D. B. Turner-Evans, B. M. Kayes et al., *Nano. Lett.* 8 (2), 710 (2008).
L. Tsakalakos, J. Balch, J. Fronheiser et al., *Appl. Phys. Lett.* 91 (23) (2007).
V. L. Pushparaj, M. M. Shaijumon, A. Kumar et al., *Proc. Natl. Acad. Sci. U. S. A.* 104 (34), 13574 (2007).

E. Sunden, J. K. Moon, C. P. Wong et al., *J. Vac. Sci. Technol. B* 24 (4), 1947 (2006).
Y. J. Jung, S. Kar, S. Talapatra et al., *Nano. Lett.* 6 (3), 413 (2006).
N. R. Raravikar, A. S. Vijayaraghavan, P. Keblinski et al., *Small* 1 (3), 317 (2005).
E. B. Sansom, D. Rinderknecht, and M. Gharib, *Nanotechnology* 19, 035302 (2008).
D. Meissner, R. Memming, and B. Kastening, *Chem. Phys. Lett.* 96 (1), 34 (1983).
M. P. Zach, K. Inazu, K. H. Ng et al., *Chem. Mater.* 14 (7), 3206 (2002).
S. A. Morin, F. F. Amos, and S. Jin, *J. Am. Chem. Soc.* 129 (45), 13776 (2007).
D. H. Kim, J. H. Ahn, W. M. Choi et al., *Science* 320 (5875), 507 (2008).
H. J. Fan, P. Werner, and M. Zacharias, *Small* 2 (6), 700 (2006).
Y. N. Xia, P. D. Yang, Y. G. Sun et al., *Adv. Mater.* 15 (5), 353 (2003).
R. S. Wagner and W. C. Ellis, *Trans. Metal. Soc. AIME* 233 (6), 1053-1064 (1965).
I. Lombardi, A. I. Hochbaum, P. D. Yang et al., *Chem. Mater.* 18 (4), 988-991 (2006).
J. N. Lee, C. Park, and G. M. Whitesides, *Anal. Chem.* 75 (23), 6544 (2003).
J. C. McDonald and G. M. Whitesides, *Acc. Chem. Res.* 35 (7), 491 (2002).
Z. P. Yang, L. J. Ci, J. A. Bur et al., *Nano. Lett.* 8 (2), 446 (2008).
L. Tsakalakos, J. Balch, J. Fronheiser et al., *J. Nanophotonics* 1, 013552 (2007).
G. H. Yu, A. Y. Cao, and C. M. Lieber, *Nat. Nanotechnol.* 2 (6), 372 (2007).
K. Q. Peng, Z. P. Huang, and J. Zhu, Adv. Mater. 16 (1), 73-76 (2004).
V. Gowrishankar, N. Miller, M. D. McGehee, M. J. Misner, D. Y. Ryu, T. P. Russell, E. Drockenmuller, and C. J. Hawker, Thin Solid Films 513, 289-294 (2006).
Y. Y. Wu, H. Q. Yan, and P. D. Yang, Top. Catal. 19 (2), 197-202 (2002).
T. Bogart, S. Dey, K. K. Lew, S. Mohney, and J. Redwing, Adv. Mater. 17 (1), 114-117 (2005).
B. M. Kayes, J. M. Spurgeon, T. C. Sadler, N. S. Lewis, and H. A. Atwater, Proc. 4$^{th}$ IEEE WCPEC 1, 221-224 (2006).
R. S. Wagner and W. C. Ellis, Appl. Phys. Lett. 4 (5), 89-90 (1964).
A. M. Morales and C. M. Lieber, Science 279 (5348), 208-211 (1998).
A. I. Hochbaum, R. Fan, R. R. He, and P. D. Yang, Nano Lett. 5 (3), 457-460 (2005).
A. P. Goodey, S. M. Eichfeld, K. K. Lew, J. M. Redwing, and T. E. Mallouk, J. Am.Chem. Soc. 129 (41), 12344-12345 (2007).
X. P. Wu, Q. H. Wu, and W. H. Ko, Sens. Actuators 9 (4), 333-343 (1986).
H. Ismail and U. Hashim, Proc. IEEE ICSE, 53-56 (2002).
T. L. Chu, E. D. Stokes, and R. A. Abderrassoul, Proc. IEEE Southeastcon, 1436-1441 (1989).

\* cited by examiner

POLYMER-EMBEDDED SEMICONDUCTOR ROD ARRAYS

CROSS-REFERENCE TO RELATED APPLICATIONS

The present application is related to and claims the benefit of the following copending and commonly assigned U.S. patent applications: U.S. Patent Application No. 60/966,432, titled "Polymer-embedded semiconductor rod arrays," filed on Aug. 28, 2007 and U.S. Patent Application No. 61/127,437, titled "Regrowth of Silicon Rod Arrays," filed on May 13, 2008; the entire contents of both of these applications are incorporated herein by reference.

STATEMENT REGARDING FEDERALLY SPONSORED RESEARCH OR DEVELOPMENT

The U.S. Government has certain rights in this invention pursuant to Grant No. DE-FG02-03ER15483/T-103465 awarded by DOE.

BACKGROUND

1. Field

This disclosure relates to semiconductor rod arrays. More specifically, the present disclosure describes structures comprising semiconductor rod arrays and methods for fabricating such structures.

2. Description of Related Art

Semiconductor rod arrays are structures that may be used in solar cell architectures and other sensing and electronic devices. The semiconductor rod arrays may comprise uniform or near uniform arrays grown from a substrate, such as a single crystal wafer. However, attachment of the semiconductor rod arrays to the substrate may impact the functionality of the arrays. Therefore, in some applications, it may be preferable to release the rod arrays from the substrate while maintaining the integrity of the rods and the ordering of the array.

Embedding of nanoscale inorganic species in polymers has been achieved for carbon nanotubes CdS nanoparticles, Mo nanowires, and ZnO nanorods. However, methods known in the art may be limited in their ability to combine flexibility with crystallinity and long range order. Such methods may also not be able to impose, create, and maintain ordered, oriented arrays of inorganic nanoscale or microscale wires in macroscale devices.

Single-crystal inorganic semiconductors currently enable the most efficient solar cells, but their rigidity precludes use of inexpensive processing schemes such as roll-to-roll manufacturing and/or their application in flexible forms for installation. While amorphous and multi-crystalline films of inorganic semiconductors can be grown on pliable substrates such as sheets of stainless steel or polymeric substrates, solar cells processed from these disordered absorber materials exhibit a solar energy conversion efficiency significantly less than single-crystals. Organic and hybrid organic/inorganic solar cells offer flexibility and processability, but suffer from instability of the organic light-absorbing and/or charge-conducting material under prolonged illumination.

SUMMARY

The present disclosure describes a structures consisting of well-ordered arrays of semiconductor structures obtained by removing the semiconductor structures from a substrate while retaining the integrity and the order of the structures. The present disclosure also describes a method for obtaining such structures, where the method may comprise casting a polymer or other binder phase onto the structures and then the polymer/binder film, or layers of this processible film material, are removed along with the embedded rods.

An embodiment of the present invention is a structure comprising: a binder material layer; and an ordered array of spaced apart semiconductor structures, wherein each one of the semiconductor structures has a length dimension and wherein the semiconductor structures are conformably constrained along at least a portion of the length dimension of each semiconductor structure within the binder material layer.

Another embodiment of the present invention is a method for fabricating semiconductor structures comprising: growing ordered oriented semiconductor structures on a substrate; depositing a film layer on the substrate, wherein the film layer comprises a binder material and wherein the binder material encapsulates one or more of the semiconductor structures at and above the substrate; and separating the film layer from the substrate at or near a location where the film layer contacts the substrate, where the ordering and orientation of one or more of the semiconductor structures is maintained in the film layer.

Still another embodiment of the present invention is a method for fabricating semiconductor structures comprising: forming one or more rod arrays on at least a portion of a substrate, wherein individual rods in the rod arrays each have a first end disposed adjacent to the substrate and a second end disposed distal to the substrate; depositing binder material on the substrate, wherein the binder material conformably fills gaps between the individual rods and the binder material forms a film layer with a bottom surface adjacent to the substrate and a top surface; forming the film layer into a solid layer with the rod arrays embedded within the film layer; and, separating the film layer and a plurality of the individual rods from the substrate at or near the bottom surface of the film layer.

No limitation is intended by the description of exemplary embodiments briefly described above or those described in additional detail below.

DETAILED DESCRIPTION

Figure 1A:
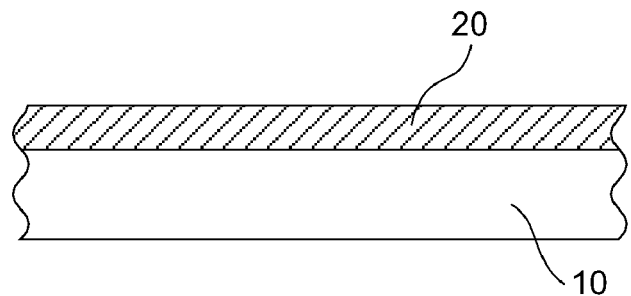
FIGS. 1A-1I illustrate a method for growing semiconductor rod arrays from a substrate.

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. The term 'aspect ratio' refers to the ratio of a structure's length to its width. Hence, the aspect ratios of the elongate structures will greater than one. The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity. Further the term "vertical" with reference to wires, rods, whiskers, pillars, etc., generally refers to structures that have a length direction that is elevated somewhat from horizontal. The term "vertical alignment" generally refers to an alignment or orientation of a structure or structures that is elevated from horizontal. The structure or structures do not have to be completely normal to horizontal to be considered to have a vertical alignment. The term "array" generally refers to multiple numbers of structures distributed within an area and spaced apart, unless otherwise indicated. Structures within an array all do not have to have the same orientation. The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal. The term "ordered" generally refers to the placement of elements in a specified or predetermined pattern where the elements have distinct spatial relationships to one another. Hence, the term "ordered array" generally refers to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings.

Within this description, the term "semiconductor" is generally used to refer to elements, structures, or devices, etc. comprising materials that have semiconductive properties, unless otherwise indicated. Such materials include, but are not limited to: elements from Group IV of the periodic table: materials including elements from Group IV of the period table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconductor structure" refers to a structure consisting of, at least in part, semiconductor material. A semiconductor structure may comprise either doped or undoped material.

Semiconductor rod arrays are promising materials in the development of solar cell architectures and other sensing and electronic devices. However, as discussed above, the semiconductor rod arrays are typically fabricated from a substrate, thus the rod arrays stay in contact with the substrate. Embodiments of the present invention enable removal of the rods into a flexible, processible form after the rods have been fabricated. According to embodiments of the present invention, a polymer film or other binder phase film is cast onto the arrays, then the polymer/binder film, or layers of this processible film material, are removed along with the embedded rods. Therefore, embodiments of the present invention provide for removing arrays of rods or other semiconductor structures from a substrate while retaining the integrity of the rods or structures and the order of the array. The embedded rod arrays allow characterization of the rods and enable a variety of device architectures involving varying bottom and top contacts to individual rods.

As discussed below, embodiments of the present invention may be used in photocell applications. As such, the semiconductor structures preferably comprise semiconductor material having properties for effective solar energy absorption and conversion of that energy to electricity. Such material may comprise crystalline silicon, either monocrystalline silicon or polycrystalline silicon, and doped or undoped. The semiconductor material may also be amorphous silicon, micromorphous silicon, protocrystalline silicon or nanocrystalline silicon. The semiconductor material may also be cadmium telluride; copper-indium selenide, copper indium gallium selenide gallium arsenide, gallium arsenide phosphide, cadmium selenide, indium phosphide, or a-Si:H alloy or combinations of other elements from groups I, III and VI in the periodic table; or other inorganic elements or combinations of elements known in the art for having desirable solar energy conversion properties. In other applications, the use of semiconductor material particularly suitable for solar energy conversion may not be as important. Therefore, other embodiments may comprise semiconductor material that is suitable for forming desired ordered arrays of semiconductor structures.

Embodiments of the present invention also provide that the properties of the semiconductor rods may be measured separate from that of the substrate. That is, given that the as-grown semiconductor rods are attached to the substrate, measurements of optical properties of such rods are convoluted with the properties of the substrate, whereas in a polymer or supporting film, the optical properties are dominated by those of the rods. Embodiments of the present invention may provide structures that are particularly useful for devices such as solar cells, electronic devices that are grown off of a substrate and transferred into a polymer or film-based material, photonic materials that utilize optical properties of periodic structures of light-absorbing or light-directing materials arranged with structural order in another optically different material, sensors, and similar chemical, optical, and electronic devices and structures.

Some applications may require growing rods using an expensive single crystal wafer, which increases the cost of the growth process. Embodiments of the present invention may also allow reuse of the substrate material. As such, the ability to remove the rods and reuse the substrate could make such structures provided by embodiments of the present invention more cost effective.

As indicated, semiconductor structures may be fabricated on a substrate. The semiconductor structures may be fabricated using bottom-up processes such as the vapor-liquid-solid (VLS) growth process as described below in reference to FIGS. 1A-1I. Other techniques for bottom-up fabrication of semiconductor structures may be used and are briefly discussed below. Also, the semiconductor structures may be formed using top-down processes, such as photolithography and etching processes known in the art and briefly discussed below. Therefore, embodiments of the present invention are not limited to the semiconductor rod array fabrication techniques disclosed or described herein.

A method for forming semiconductor structures such as rod arrays is now described. An Si <111> wafer may be used as the material from which the wire arrays are grown. All or portions of the wafer may be doped. For example, a degenerately doped N-type Si wafer may be used. As shown in FIG. 1A, a surface oxide layer 20 is thermally gown on the wafer 10. The surface oxide layer may be grown to a thickness of 285 nm, 300 nm, or other thicknesses. The oxide layer 20 may also be deposited via chemical vapor deposition (CVD) or other methods known in the art.

Figure 1B:
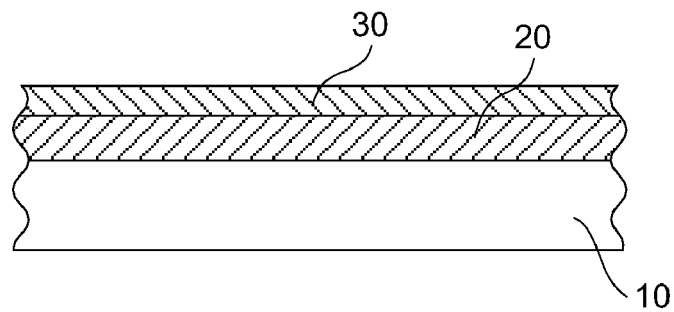
Figure 1C:
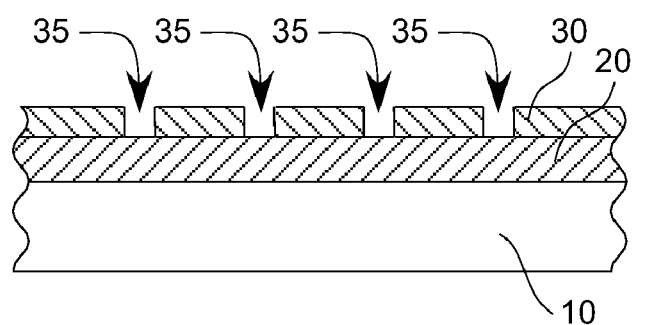
Figure 1D:
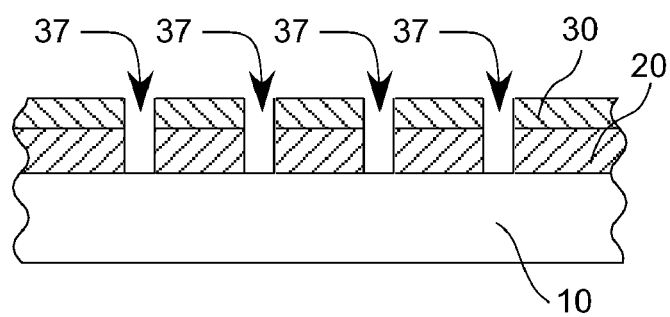
Figure 1E:
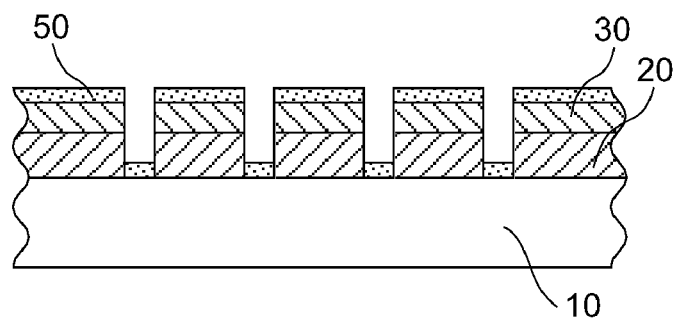
Figure 1F:
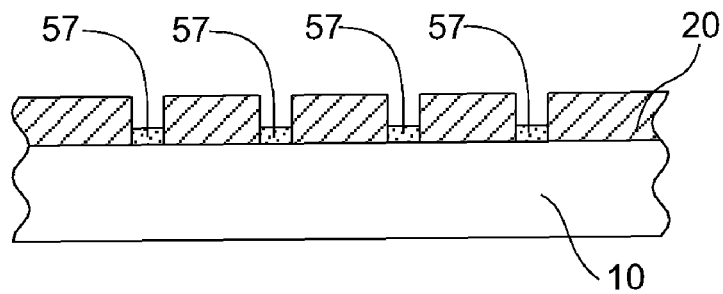

As shown in FIG. 1B, a photoresist layer 30 is applied. The photoresist layer may comprise S1813 photoresist from MicroChem. Corp. (Newton, Mass., USA) or other photoresist material. The photoresist layer 30 is then exposed to a desired array pattern and developed with a developer to form a desired pattern of holes 35 in the resist layer 30 as shown in FIG. 1C. The developer may comprise MF-319 or other developers known in the art. The patterned resist layer 30 is then used to etch the oxide layer 20 on the Si wafer 10 as shown in FIG. 1D. Etching of the oxide layer may be achieved by using hydrofluoric acid compositions such as buffered HF (9% HF, 32% $NH_4F$) from Transene Company, Inc. (Danvers, Mass., USA). Other etching techniques known in the art may also be used to etch the oxide layer 20. The result of the etching will be a pattern of holes 37 in the oxide layer as shown in FIG. 1D.

A method for forming semiconductor structures such as rod arrays is now described. An Si <111> wafer may be used as the material from which the wire arrays are grown. All or portions of the wafer may be doped. For example, a degenerately doped N-type Si wafer may be used. As shown in FIG. 1A, a surface oxide layer 20 is thermally grown on the wafer 10. The surface oxide layer may be grown to a thickness of 285 nm, 300 nm, or other thicknesses. The oxide layer 20 may also be deposited via chemical vapor deposition (CVD) or other methods known in the art.

Figure 1G:
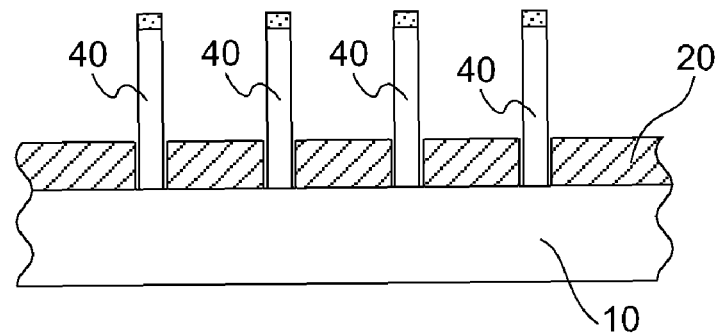

The wafer 10 with the patterned oxide layer 20 and the deposited catalyst may then be annealed. Preferably, the annealing is performed in a tube furnace at a temperature between 900 to 1000° C. or at a temperature of about 1050° C. for 20 minutes with the application of 1 atm of $H_2$ at a flow rate of 1000 sccm (where SCCM denotes cubic centimeters per minute at STP). Growth of wires on the wafer 10 is then performed. FIG. 1G shows the growth of wires 40 in a wire array through the application of a growth gas. Preferably, the wires 40 are grown in a mixture of $H_2$ (1000 sccm) and $SiCl_4$ (20 sccm) at about 1 atm. The wires 40 may be grown for between 20 to 30 minutes at temperatures between 850° C. to 1100° C. or with different growth times, pressures, and or flow rates.

Figure 1H:
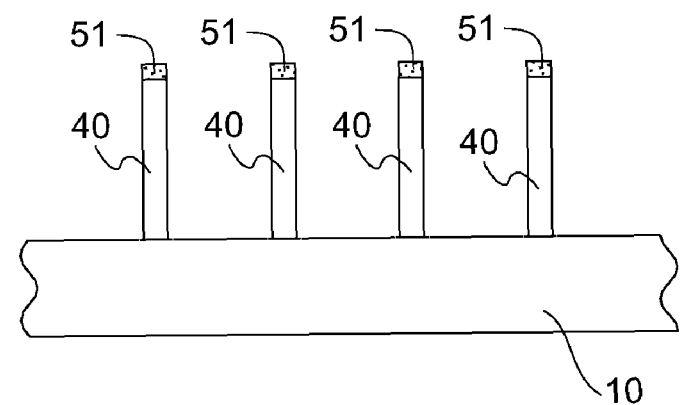
Figure 1I:
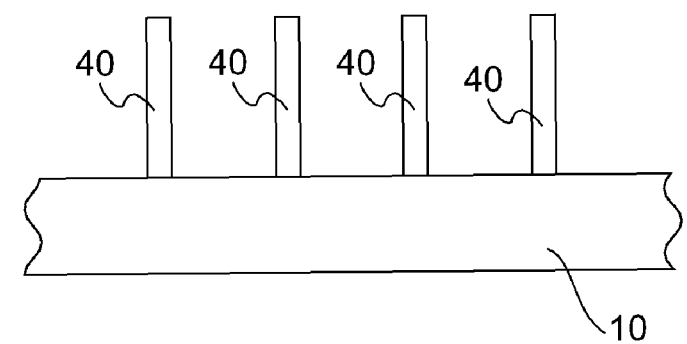

Following the growth of the wires 40, the oxide layer 20 or some portion thereof may be removed, as shown in FIG. 1H. The oxide layer 20 may be removed by etching the wafer 10 for 10 seconds in 10% HF (aq) or other methods known in the art may be used to remove the oxide layer. As shown in FIG. 1H, catalyst particles 51 may remain at the top of each grown wire 40, which may impact the functionality of the resulting wire array. Therefore, it may be advantageous to remove the catalyst particles. For example, if the catalyst comprises Au, the gold particles may be removed by soaking the wafer 10 for 10 min in a TFA solution from Transene Company, Inc., which contains $I^-/I_3^-$. Other methods known in the art may also be used to remove catalyst particles. FIG. 1I shows the wires 40 with the catalyst particles 51 removed.

Figure 2:
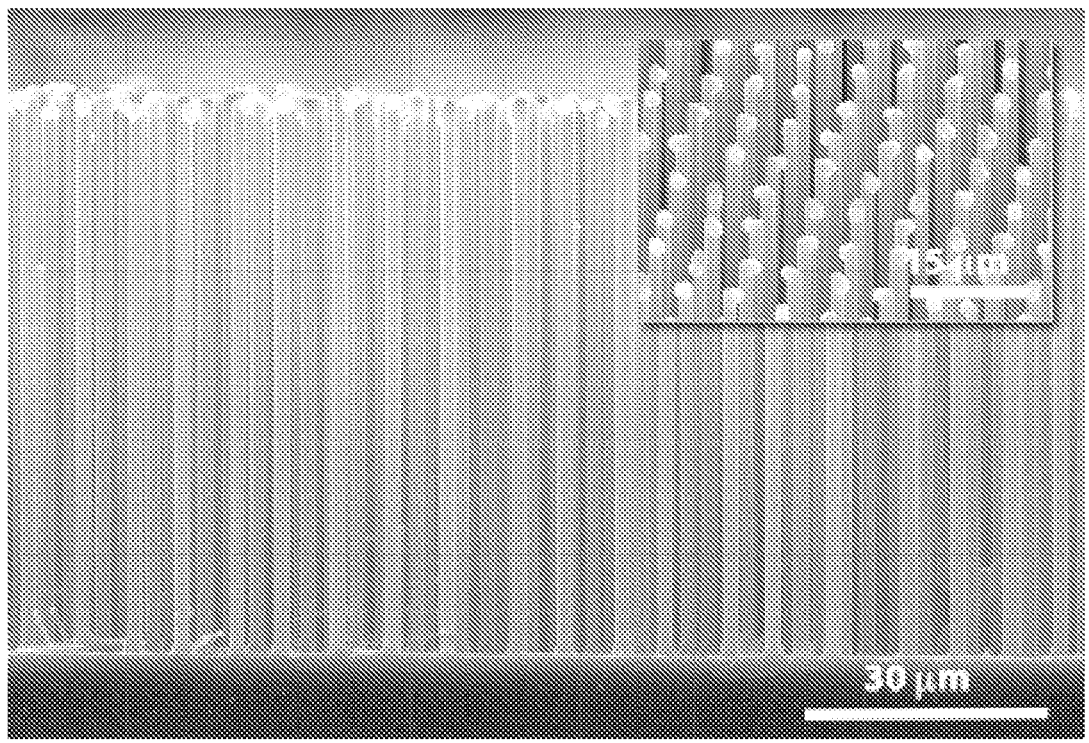
FIG. 2 shows a cross-sectional scanning electron microscopy (SEM) image of a vertically aligned Si wire array fabricated using the method illustrated in FIGS. 1A-1I.

Using the method described above and illustrated with FIGS. 1A-1I provides well-ordered, vertically oriented, crystalline Si wires that may be 1.5-2.0 μm in diameter, greater than 70 μm long, and spaced on the substrate with a 7 μm center-to-center pitch. However, as indicated, methods other than that described above and illustrated in FIGS. 1A-1I may be used to fabricate semiconductor rod arrays. FIG. 2 shows a cross-sectional scanning electron microscopy (SEM) image of a completely well-ordered, vertically aligned Si wire array of uniform length and diameter grown using the method described above and using a Ni catalyst. The catalyst particle remained at the top of the wires. The inset shown in FIG. 2 provides a 45° angle SEM image of the same structure.

Figure 12A:
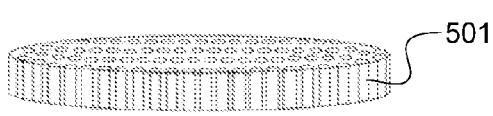
FIGS. 12A-12F depict the fabrication of nanorods using an AAO membrane as a template.
Figure 12B:
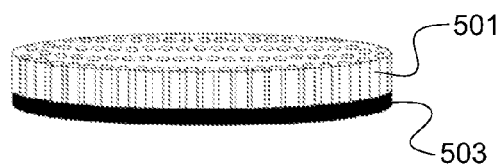
Figure 12C:
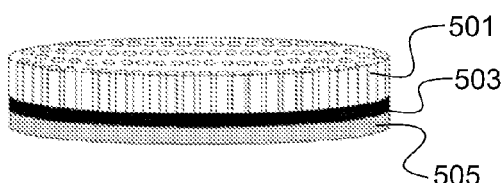

As indicated, methods other than growth of semiconductor structures from a substrate may also be used to provide semiconductor structures suitable for removal from a substrate for use in embodiments of the present invention. FIGS. 12A-12F depict the fabrication of nanorods using an AAO membrane as a template. FIG. 12A depicts an AAO membrane 501. Nanorod array electrodes may be fabricated using commercially available, 60 μm thick, 200 nm pore diameter, AAO membranes (Whatman Scientific) as templates. FIG. 12B depicts the sputtering of a thin CdSe film 503 on one side of the template 501. The thin CdSe film 503 may comprise a 300 nm thick layer of CdSe 503 (deposited using a RF magnetron sputterer, CdSe sputter target of 99.995% purity, Kurt J. Lesker Company) deposited onto one side of the AAO template 501 to cover the bottoms of the pores. FIG. 12C depicts the sputtering of a Ti ohmic back contact layer 505 onto the back of the CdSe layer 503. The Ti ohmic back contact layer 505 may be fabricated by sputtering 1.5 μm of Ti (99.995% purity Ti sputter target, Kurt J. Lesker Company) onto the back of the CdSe layer 503. The other side of the AAO template 501 was then covered in a layer of mounting wax (not shown), to prevent deposition of metal, in subsequent steps, onto the bottoms of the pores. The template was then made into a working electrode by attaching a Cu wire and applying conductive Ag paint around the edge of the membrane. The wire was encased in a glass tube, and the wire contact area was sealed with epoxy.

Figure 12D:
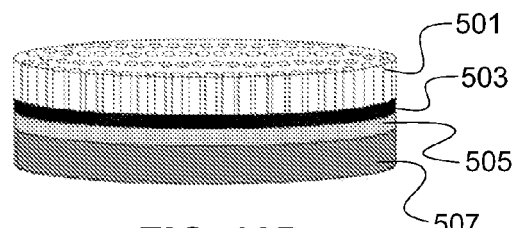
Figure 12E:
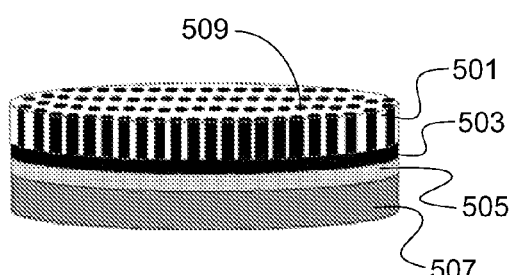

To provide mechanical stability and support for the nanorod array after the removal of the template, >10 μm of Ni metal was then electrodeposited onto the back of the Ti. FIG. 12D depicts the deposition of the Ni metal substrate 507 onto the Ti layer 505. The Ni substrate 507 was galvanostatically electrodeposited at room temperature, under stirring, from an aqueous solution of 0.8 M nickel (II) sulfamate ($Ni(SO_3NH_2)_2$) and 0.6 M boric acid ($H_3BO_3$). In this process, a current density of 25 mA cm$^{-2}$ was maintained for 1 hr between the working electrode and a Pt gauze counterelectrode. The mounting wax was then thoroughly removed by several washes in acetone. $CdSe_{0.65}Te_{0.35}$ was then electrodeposited into the pores using an aqueous deposition bath that contained 0.2 M $CdSO_4$, 20 mM $SeO_2$, and 10 mM $TeO_2$ in 1 M $H_2SO_4$. FIG. 12E shows the deposition of the CdSeTe 509 into the pores of the AAO template 501. Triton X-100 was also added (0.25%) to reduce the surface tension and to improve the quality of the deposit. In addition to the Pt gauze counter, a saturated calomel electrode (SCE) reference was used with the AAO working electrode. The electrodeposition was performed potentiostatically at −650 mV versus SCE, at room temperature, without stirring, for 5 to 30 min.

Figure 12F:
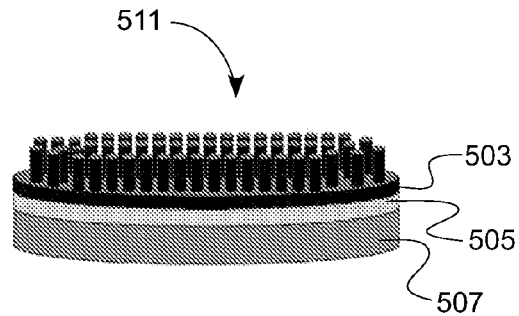
Figure 13:
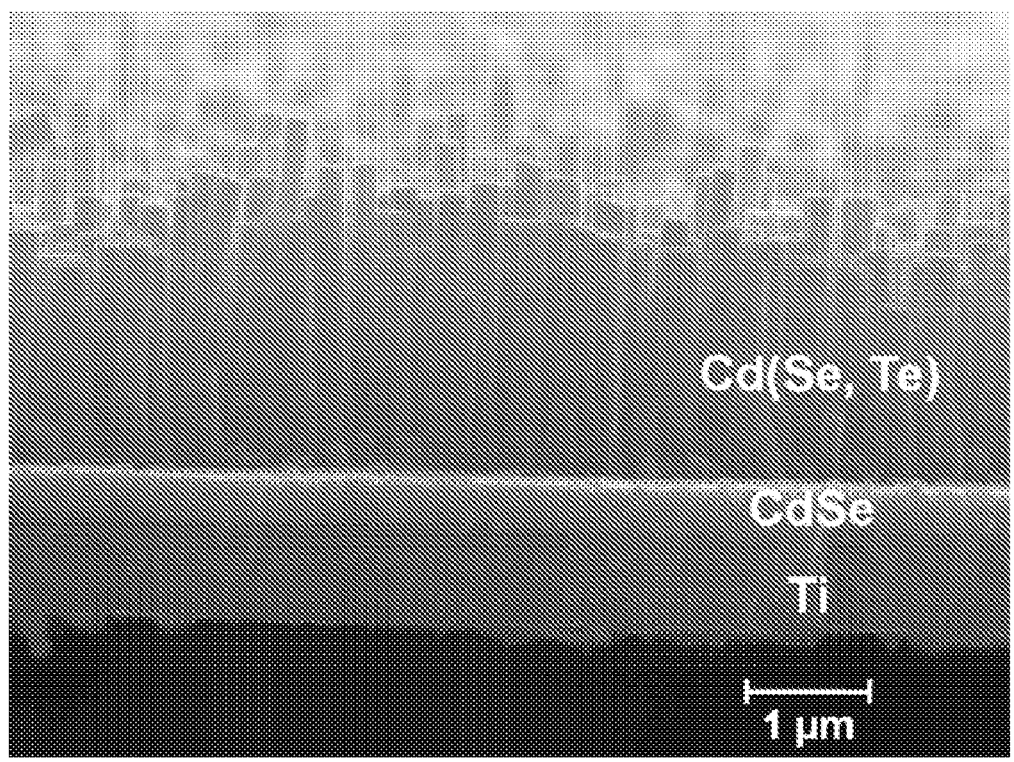
FIG. 13 shows a cross-sectional SEM image of a Cd(Se, Te) nanorod array after the removal of the AAO template.
Figure 14:
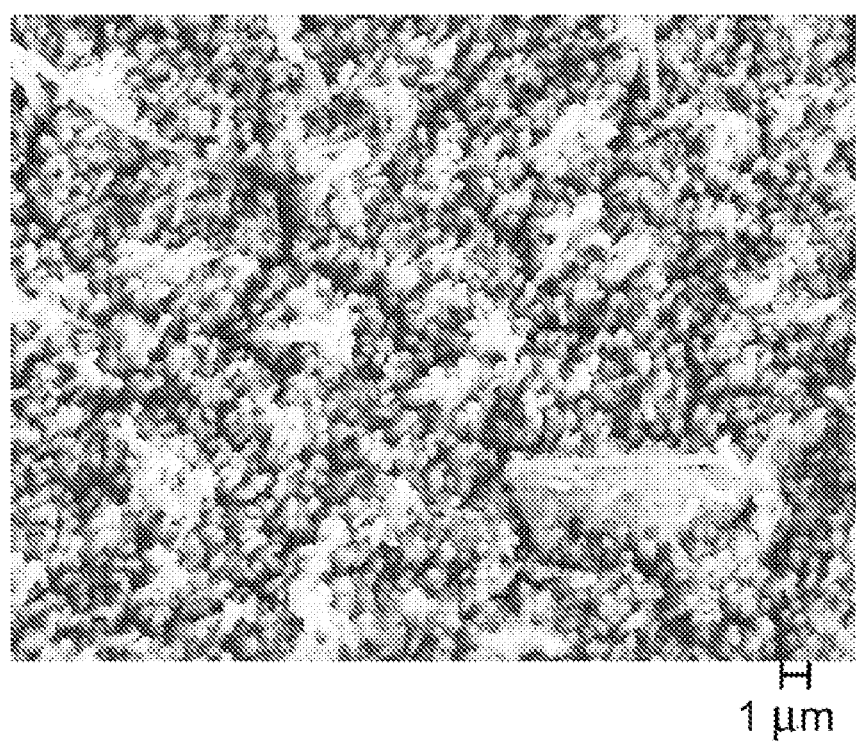
FIG. 14 displays a top-view SEM image of nanorod array electrodes.

After growth of the nanorods, the AAO template 501 was removed by submersion of the electrode assembly for 20 min into 1 M $NaOH_{(aq)}$. FIG. 12F shows the nanorods 511 remaining after the removal of the template 501. The nanorod array was then thoroughly rinsed in 18 MΩ cm resistivity $H_2O$, dried, and detached from the Cu wire. The array was then annealed for ~90 min at 600° C. in an Ar atmosphere that contained a small percentage (~0.2%) of $O_2$. The nanorod array was then cut into smaller samples (0.1-0.3 cm$^2$), and the samples were made into electrodes for use in photoelectrochemical cell measurements. FIG. 13 shows a cross-sectional SEM image of a Cd(Se, Te) nanorod array after the removal of the AAO template. The contrast in the substrate indicates the transition from the Ti ohmic back contact to the sputtered CdSe shunt-preventing layer. The Ni supporting layer is not visible in this image because when the electrode was cut, the Ni separated from the Ti at the edges of the sample. EDS indicated that the elemental composition was Cd:Se:Te in the ratio 3:2:1, to within a few percent. FIG. 14 displays a top-view SEM image of the nanorod array electrodes.

Figure 15A:
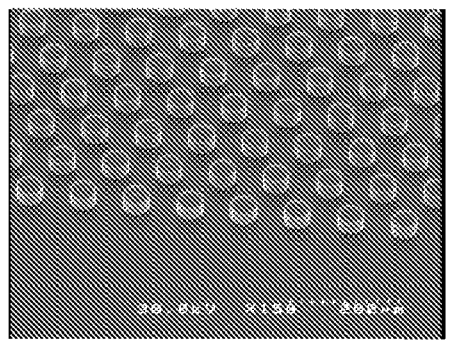
FIGS. 15A-15G show SEM images of pillars prepared by using an etch process.
Figure 15B:
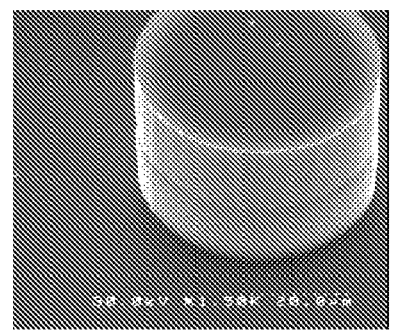
Figure 15C:
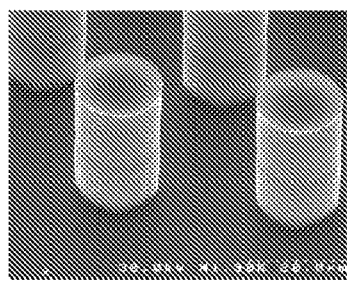
Figure 15D:
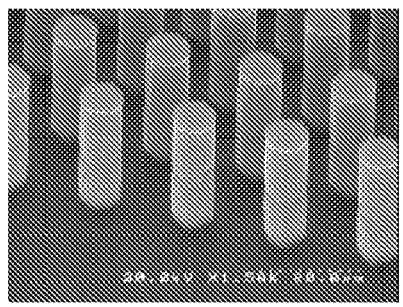
Figure 15E:
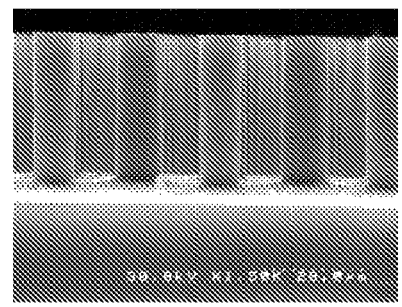
Figure 15F:
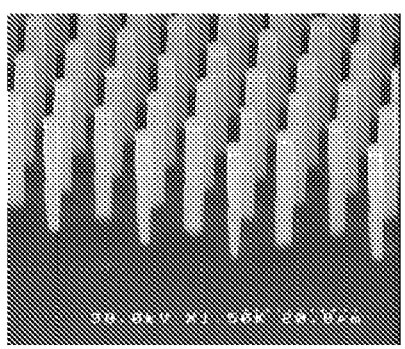
Figure 15G:
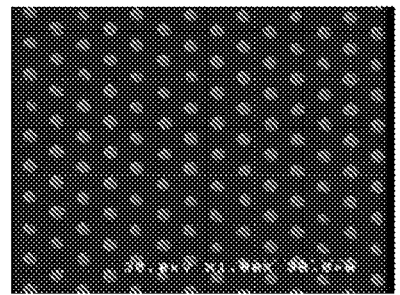

Still another method for fabricating semiconductor structures may be accomplished by etching a planar substrate to produce pillars or other semiconductor structures. The etched pillars may be fabricated using a low temperature Reactive Ion Etching (RIE) process. Such a process may be performed at nearly liquid nitrogen temperatures and can produce very deep etched structures. The planar substrate may be etched using photoresist as the masking medium. FIGS. 15A-15G show SEM images of pillars prepared by using an etch process. The photomask used to pattern the resist had areas containing arrays of 5, 10, 20, and 50 um diameter spots spaced in a hexagonal close packed array so that the same total filling fraction of pillars would result in each case. FIG. 15A shows an array of 50 μm diameter pillars and FIG. 15B shows a single 50 μm diameter pillar. FIG. 15C shows 20 μm diameter pillars. FIG. 15D shows 10 μm diameter pillars and FIG. 15E shows a side view of the 10 μm diameter pillars. FIG. 15F shows 5 μm diameter pillars and FIG. 15G shows a top down view of an array of 5 μm diameter pillars.

The three examples discussed above for forming semiconductor structures suitable for use in embodiments of the present invention are not exhaustive of the methods that may be used for forming such structures. Those skilled in the art will understand that a variety of semiconductor structure fabrication techniques may be used in accordance with embodiments of the present invention. Preferred techniques are those that provide for the fabrication of well-ordered arrays of semiconductor structures suitable for encapsulation in binder material as discussed below.

Figure 4:
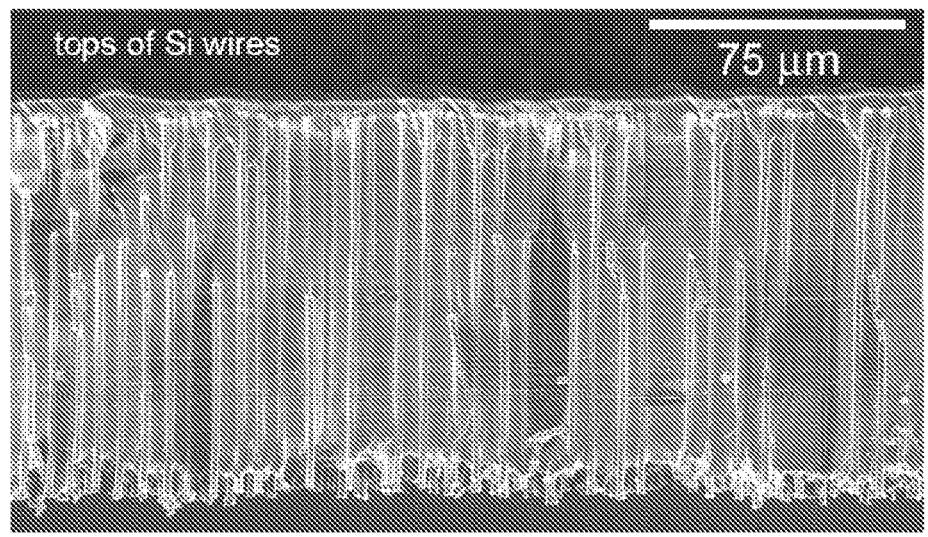
FIG. 4 shows a cross-sectional SEM image of binder material with embedded rod arrays fabricated according to the method illustrated in FIGS. 3A-3C.
Figure 3A:
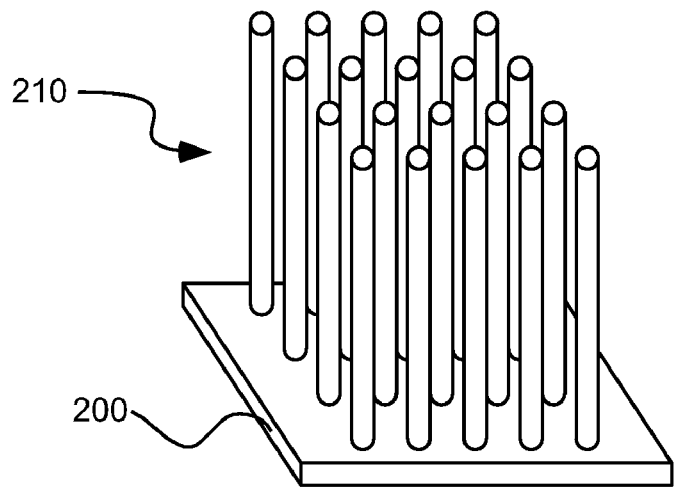
FIGS. 3A-3C illustrate a method for fabricating embedded rod arrays.
Figure 3B:
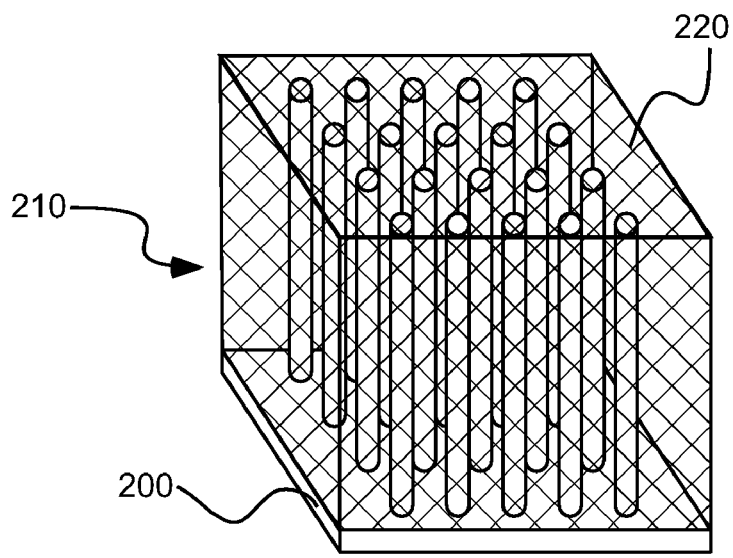
Figure 3C:
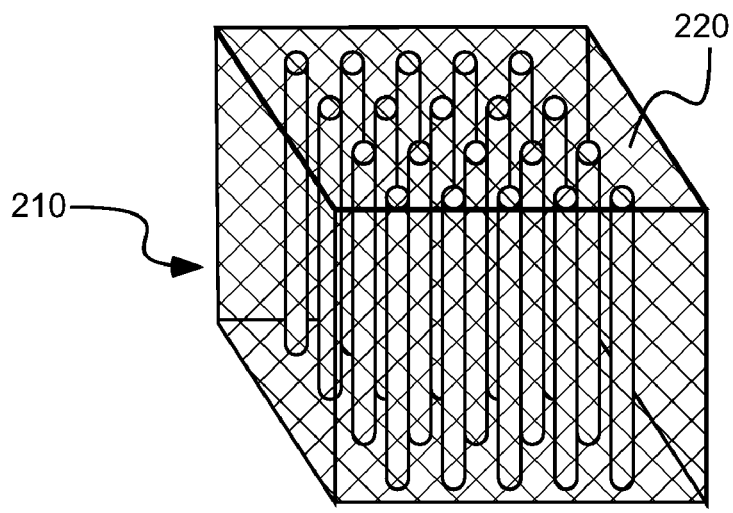

FIGS. 3A-3C illustrate a method of providing embedded rod arrays according to an embodiment of the present invention. FIG. 3A shows a substrate 200 with semiconductor rod arrays 210 projecting from the substrate 200. Note that the substrate 200 may comprise multiple layers and may include one or more oxide layers (not shown). FIG. 3B shows the application of a binder material 220 to the top surface of the substrate 200 and around the semiconductor rod arrays 210. FIG. 3C shows the structure obtained when the binder material 220 with the embedded rod arrays 210 are removed from the substrate 200. FIG. 4 shows a cross-sectional SEM image of binder material 220 (comprising a polymer film in this instance) with the embedded rod arrays 210. Note that upon removal from the substrate 200, the rod arrays were exposed only at the bottom of the binder material. Note also the conformal filling of the gaps between individual rods of the rod arrays.

In an embodiment of the present invention, the binder material may comprise polydimethylsiloxane (PDMS) polymer. The polydimethylsiloxane polymer base may comprise Sylgard 184 PDMS from Dow Corning or other such materials. The polymer base and curing agent are mixed in a 10:1 w/w ratio and stirred. The uncured polymer is diluted with methylene chloride (1.0 g/2.0 mL) and drop-cast on the semiconductor rod arrays such that a smooth polymer surface is preferably observed. These arrays are then allowed to sit for some time to allow slow evaporation of the methylene chloride. After 13-16 hours the PDMS is still tacky, and is cured by heating to 120° C. for 1.5-2.0 hours. After cooling, the PDMS overlayer and embedded rods are removed from the substrate using a cutting device, such as scraping the substrate with a razor blade. The resulting polymer film has the semiconductor rod arrays embedded with the same ordering as observed on the surface.

The method described above can yield flexible, polymer-supported arrays of crystalline Si wires in a transparent, mechanically and chemically robust, PDMS film. Semiconductor rod arrays with areas greater than 1 cm$^2$ can be embedded and removed in a single polymer film. The area of the rod-embedded film may be limited only by the size of the initial array, which, in turn, may be limited by the diameter of the furnace used to grow the rod arrays. As shown in FIG. 4, the obtained PDMS/rod array composite film provides intimate contact was made between the wires and the PDMS. The SEM image of FIG. 4 also attests to the structural robustness of the rod arrays even after removal from the substrate.

Figure 5A:
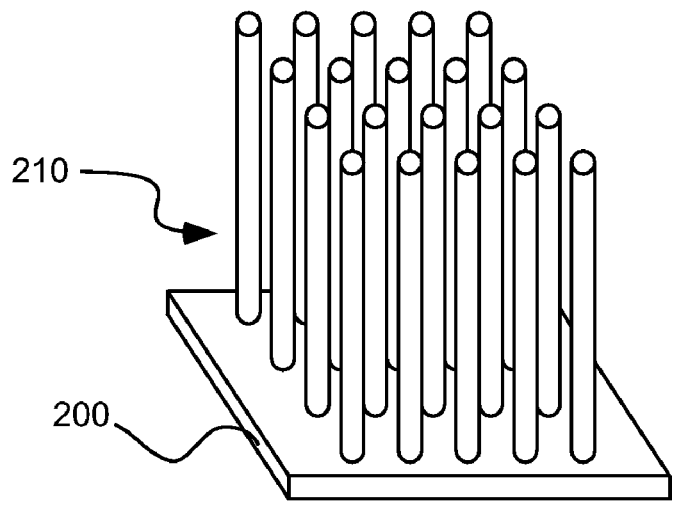
FIGS. 5A-5C illustrate an alternative method for fabricating embedded rod arrays.
Figure 5B:
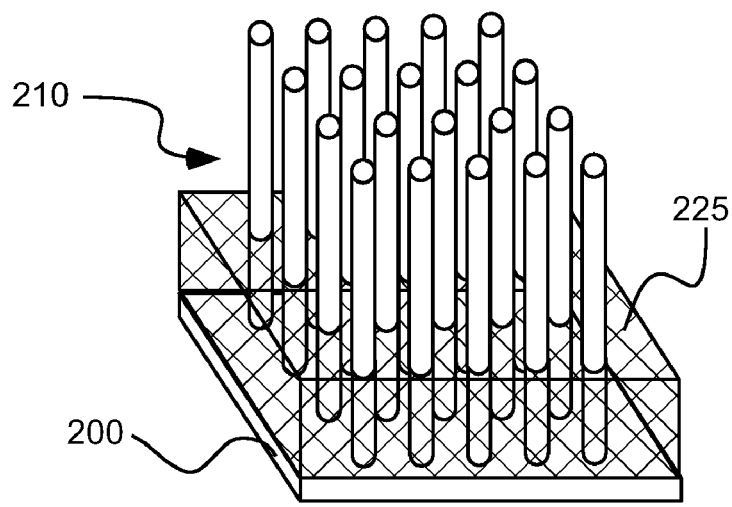
Figure 5C:
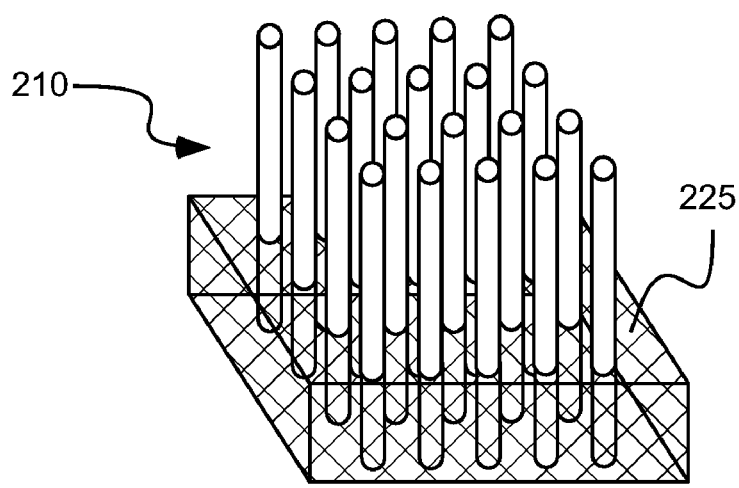

As noted, the embodiment described above may provide for electrical contact to the bottom ends of the semiconductor rod arrays (the ends which were previously connected to the substrate), but the top ends of the rod arrays may be covered by the polymer, making electrical contact to those ends more difficult. In an alternative embodiment, a thinner binder material layer is applied to the substrate and around the semiconductor rod arrays. FIGS. 5A-5C illustrate this embodiment.

FIG. 5A shows a substrate 200 with semiconductor rod arrays 210 projecting from the substrate 200. Note again that the substrate may comprise multiple layers and may also include one or more oxide layers (not shown). FIG. 5B shows the application of a binder material layer 225 to the top surface of the substrate 200 and around the semiconductor rod arrays 210, but at a thickness less than the height of the rod arrays. FIG. 5C shows the structure obtained when the binder material 225 with the embedded rod arrays 210 projecting from the binder material 225 are removed from the substrate 200. FIG. 4 shows a cross-section SEM image of binder material 220 (comprising a polymer film in this instance) with the embedded rod arrays 210. Note that upon removal from the substrate 200, the rod arrays were exposed only at the bottom of the binder material. Note also the conformal filling of the gaps between individual rods of the rod arrays.

In the alternative embodiment described above, spin casting may be used to apply the binder material. For example, the polymer base and curing agent mix described above may be diluted with a solution of hexamethylcyclotrisiloxane (Alfa Aesar, 97%, nearly saturated in methylene chloride) where the preferred dilution ratio may be four parts hexamethylcyclotrisiloxane to one part of the polymer and curing agent mix. To produce a thinner film, the low-boiling-point siloxane was added to the PDMS solution that is used to form the polymer/rod array composite. The diluted mixture is then spin-cast on the rod arrays at 1000 rpm for 2 min. After spin-coating, the methylene chloride rapidly evaporates, and the samples are cured at 150° C. for 0.5 hours. The low-boiling-point siloxane evaporated significantly during the curing step, resulting in 20 µm thick polymer films in which greater than 50% of the wires were exposed. After curing and cooling, the PDMS overlayer and embedded rods are again removed from the substrate using a cutting device.

Figure 6A:
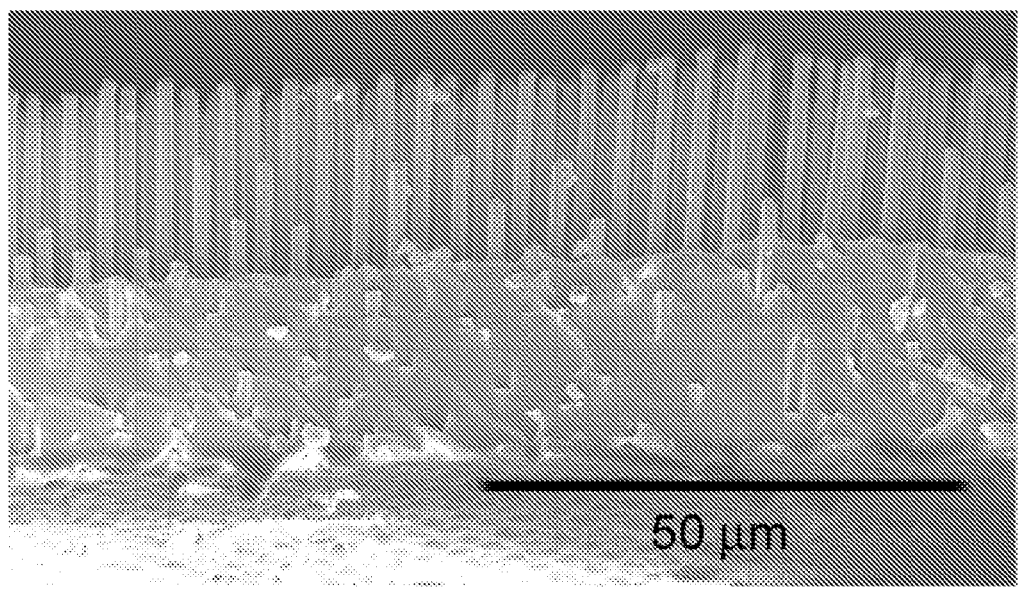
FIGS. 6A and 6B show SEM images of binder material with embedded rod arrays fabricated according to the method illustrated in FIGS. 5A-5C.
Figure 6B:
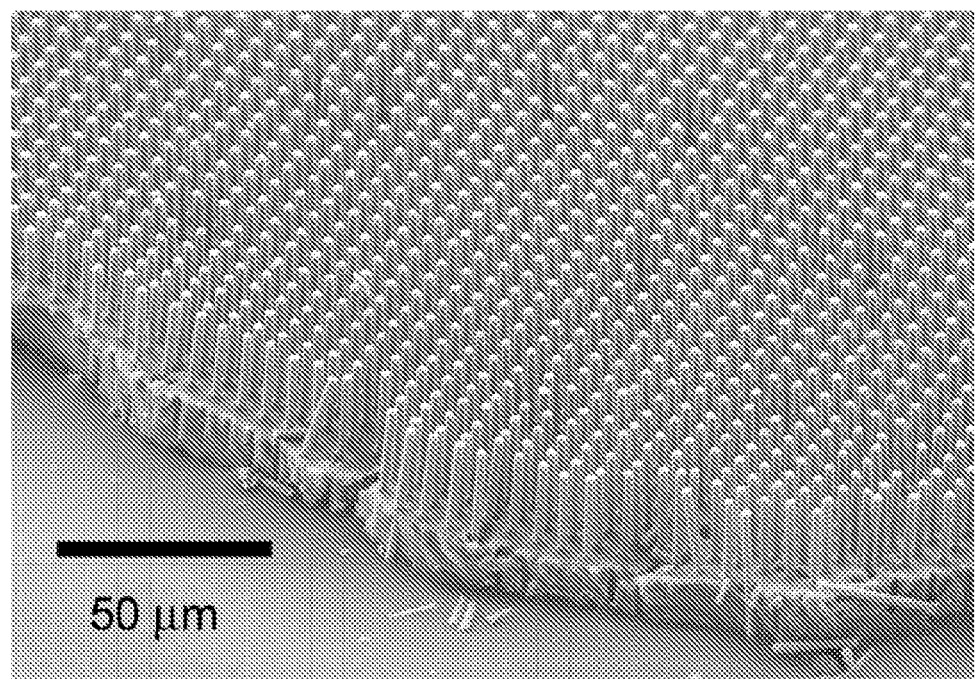

The alternative embodiment described may provide a structure where both sides of the rod arrays are exposed. See FIG. 6A, which shows a cross-section SEM image of a thinner binder material layer that has a significant fraction (>50%) of the rod array length emerging from the binder material layer while the array pattern is maintained. FIG. 6B shows a 45° SEM image of the structure with the rod arrays projecting from the binder material layer. Such a structure may be electrically conductive from top to bottom, but exhibit immeasurably high resistances laterally, indicating that the individual rods in the rod array are electrically isolated from each other in the binder material layer.

Figure 7:
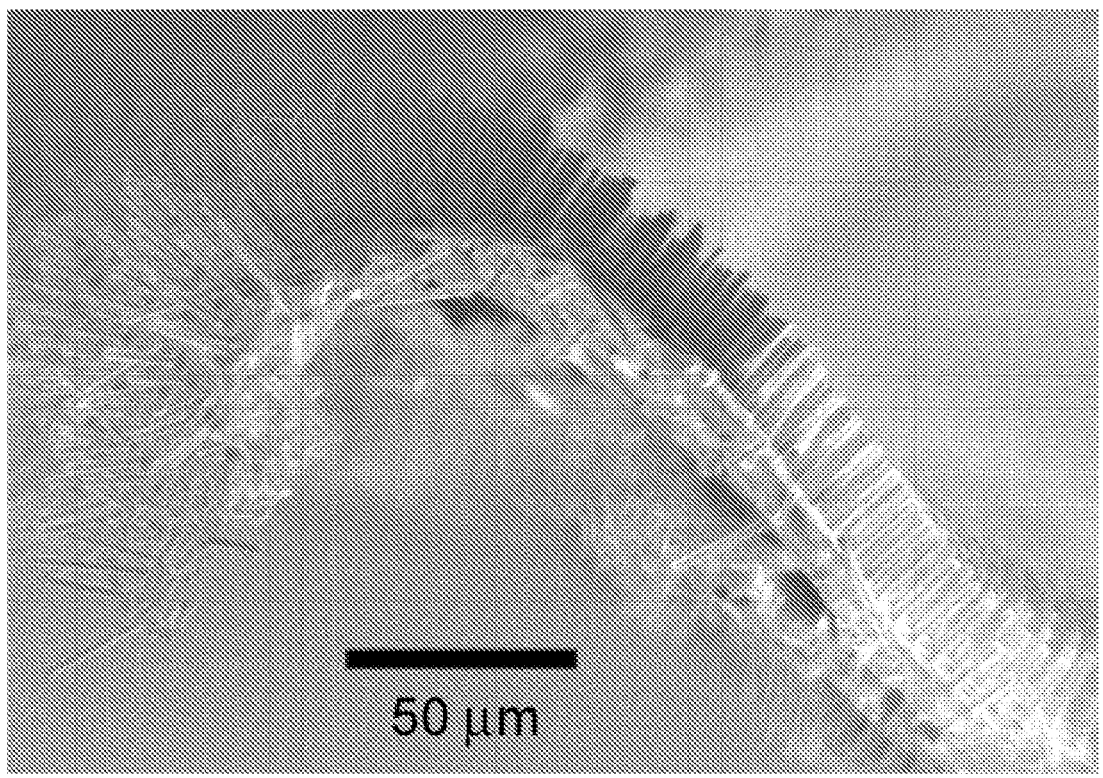
FIG. 7 shows a cross-sectional SEM image of flexed binder material with embedded rod arrays.

The binder material layers with embedded rod arrays exhibit several properties indicative of facile processability. The as-removed layers (or films) can be very flexible, and can be bent. See, for example, FIG. 7, which shows a cross-sectional SEM image of a flexed portion of a binder material layer with embedded rods. The layers may also have the capability of being rolled into cylinders having diameters as small as several millimeters without damage to the embedded rod arrays. Inspection of SEM images on a curling film reveals that the wires are not damaged or dislodged during movement of the PDMS as shown in FIG. 7.

Figure 8:
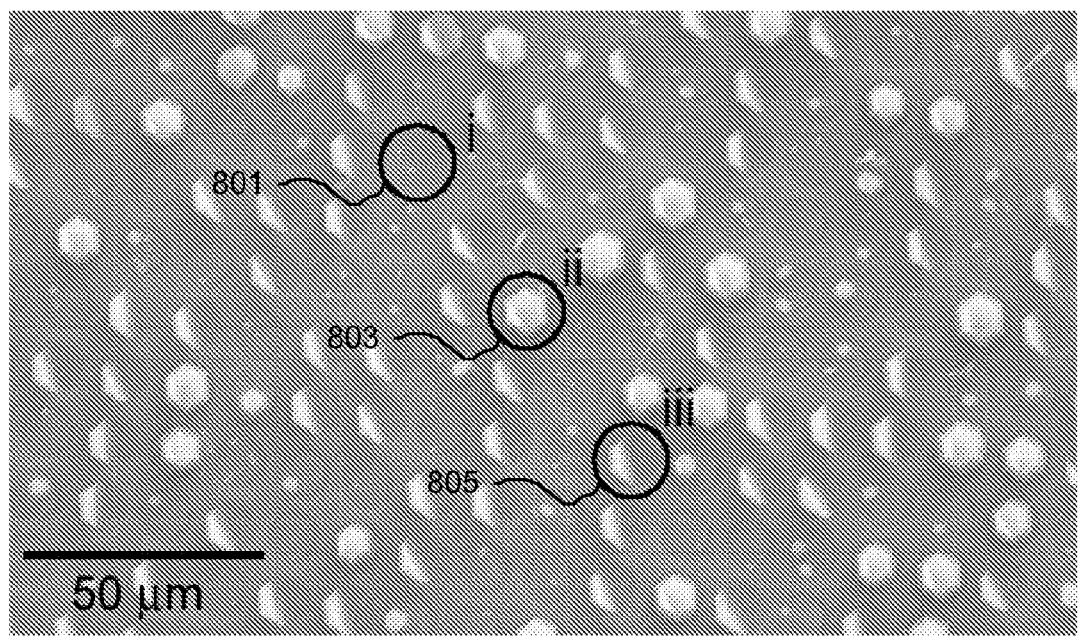
FIG. 8 shows a SEM image of a substrate after the removal of binder material.

After removal of the rod arrays from the substrate, SEM images of a typical area of the substrate show that the rod arrays had been broken off at or near the surface of the substrate. FIG. 8 shows a SEM image of a substrate after the removal of binder material with embedded rods. Circle 801 in FIG. 8 shows a region where the rod of the rod array has been removed flush with the substrate. Circle 803 shows a flat-topped stub, where the rod has been broken off slightly above the base of the rod. Circle 805 shows an angled stub. The cleanliness of array removal suggests that minimal preparation would be required to reuse the substrate and/or the patterned template that may have been formed to direct the patterned growth of the rods in the rod array.

Note other embodiments of the present invention may use other methods to transfer arrays of semiconductor structures into a binder material layer. Such methods should preferably accomplish the transfer by maintaining the original orientation and ordering of the semiconductor structures (i.e., the orientation and ordering achieved through the initial fabrication process) upon the transfer of the semiconductor structures to the binder material layer.

Embodiments of present invention may comprise a binder material layer or binder material layers other than the polymers discussed above. As indicated, preferred binder material comprises material that can deposited around semiconductor structures on a substrate or base layer and that can conformably attach around at least a portion of the semiconductor structures. As indicated, the semiconductor structures are cut or otherwise released from the substrate or base layer, so the binder material preferably provides enough resilience to maintain the position and orientation of the semiconductor structures during the release process and holds the structures upon removal of the binder material layer. The binder material layer may comprise non conductive organic materials including (but not limited to): main-chain carbon polymers such as poly(dienes), poly(alkenes), poly(acrylics), poly (methacrylics), poly(vinyl ethers), poly(vinyl thioethers), poly(vinyl alcohols), poly(vinyl ketones), poly(vinyl halides), poly(vinyl nitrites), poly(vinyl esters), poly(styrenes), poly(aryienes), etc.; main-chain acyclic heteroatom polymers such as poly(oxides), poly(carbonates), poly(esters), poly(anhydrides), poly(urethanes), poly(sulfonates), poly(siloxanes), poly(sulfides), poly(thioesters), poly(sulfones), poly(sulfonamides), poly(amides), poly(ureas), poly (phosphazenes), poly(silanes), poly(silazanes), etc.; and main-chain heterocyclic polymers such as poly(furan tetracarboxylic acid diimides), poly(benzoxazoles), poly(oxadiazoles), poly(benzothiazinophenothiazines), poly(benzothiazoles), poly(pyrazinoquinoxalines), poly(pyromenitimides), poly(quinoxalines), poly(benzimidazoles), poly(oxindoles), poly(oxoisoindolines), poly(dioxoisoindolines), poly(triazines), poly(pyridazines), poly(piperazines), poly(pyridines), poly(piperidines), poly(triazoles), poly(pyrazoles), poly(pyrrolidines), poly(carboranes), poly(oxabicyclononanes), poly (dibenzofurans), poly(phthalides), poly(acetals), poly(anhydrides), carbohydrates, etc. The binder material layer may also comprise conductive organic material including (but not limited to): conducting polymers (poly(anilines), poly (thiophenes), poly(pyrroles), poly(acetylenes), etc.)); carbonaceous materials (carbon blacks, graphite, coke, $C_{60}$, etc.); charge transfer complexes (tetramethylparaphenylenediamine-chloranile, alkali metal tetracyanoquinodimethane complexes, tetrathiofulvalene halide complexes, etc.); and other such material. The binder material layer may also comprise mixed inorganic/organic conductors including (but not limited to): Tetracyanoplatinate complexes; Iridium halocarbonyl complexes; stacked macrocyclic complexes, and other such materials.

Figure 9:
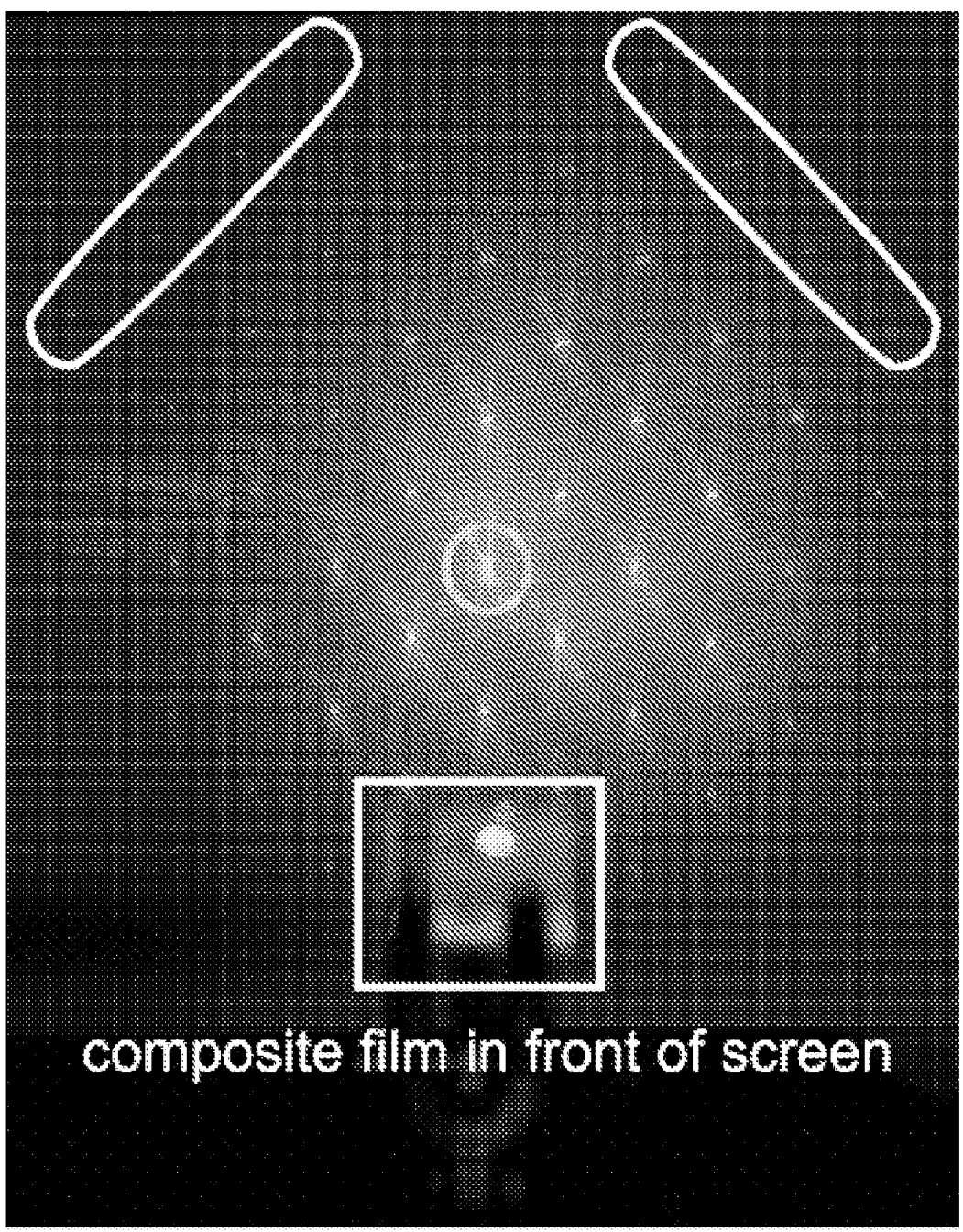
FIG. 9 shows an optical diffraction pattern produced light transmitted through a binder material layer containing embedded rod arrays.

Methods according to embodiments of the present invention may be implemented so that the original rod array pattern is not significantly stretched, contracted, or skewed. Before binder material casting, a given array showed a shortest center-to-center rod distance of 7.1 µm±0.4 µm. After binder material casting, curing, and removal from the substrate, the center-to-center distance between rods was 6.9 µm±0.3 µm. Due to the regular spacing of the rods within the rod arrays, the composite films diffracted transmitted visible light. For example, a red light source (672 nm wavelength) incident perpendicular to an embedded rod sample produced a cubic array of diffraction spots with a diffraction angle indicating an array spacing of 6.9±0.2 µm. Up to 5 orders of diffraction were observed, even after mechanical deformation. FIG. 9 shows an optical diffraction pattern produced by transmitted light, demonstrating the long range order retention in embedded rod layer. The center spot (0 order diffraction) and spots indicating 4 orders of diffraction are marked.

Figure 10A:
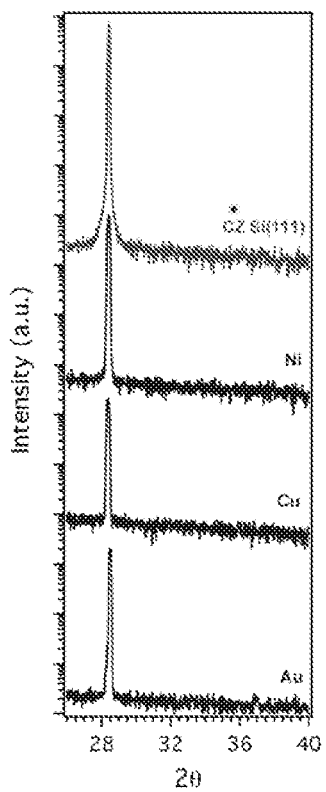
FIG. 10A presents 2θ x-ray diffraction data comparing a Czochralski (CZ)-grown Si(111) wafer to that of binder material layers having embedded Si wire arrays.
Figure 10B:
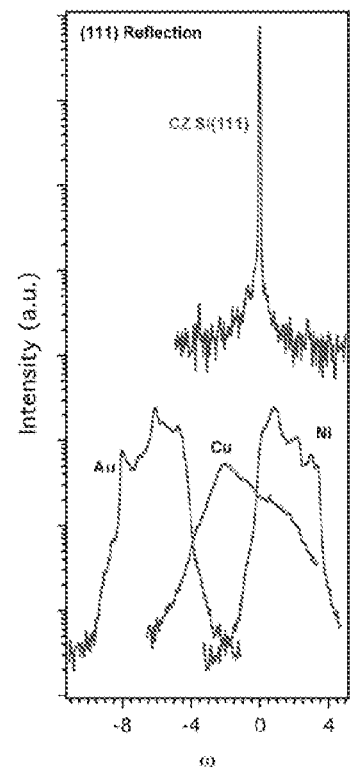
FIG. 10B shows the (111) rocking curves of binder material layers with embedded rod arrays compared to that of the CZ Si(111) wafer.
Figure 10C:
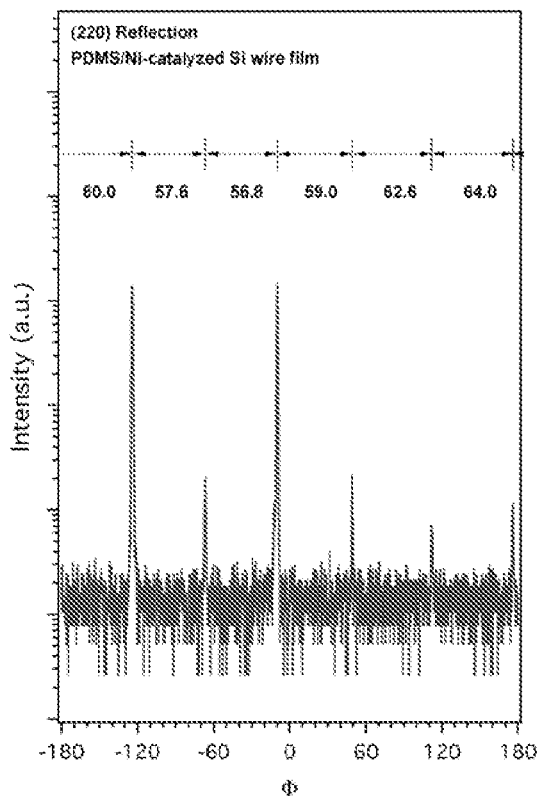
FIG. 10C is a phi scan which shows six degenerate reflections of the Si lattice.

If the rod arrays are grown from a single crystalline Si wafer as described above, embodiments of the present invention provide that the Si rods or wires in the binder material layer are highly crystalline and retain the wire orientation produced by the high-temperature growth step on the Si (111) substrate. FIG. 10A presents 2θ x-ray diffraction data comparing a Czochralski (CZ)-grown Si(111) wafer to that of PDMS composite films produced from Si wire arrays that were grown using either Au, Cu, or Ni as the VLS catalyst. All of the Si wire-embedded PDMS films, as well as the Si (111) wafer, exhibited a single (111) diffraction peak located near 28.4°. The intensity and sharpness of this reflection demonstrated the crystal quality of the composite material. FIG. 10B shows the (111) rocking curves of the PDMS/Si wire films, which were centered near that of the CZ Si(111) wafer, attesting to the highly oriented nature of the wires. The deviations of the rocking curve center relative to that of the CZ wafer indicated that the PDMS/Si wire films did not lie completely flat on the substrate holder. The structure and large full-width at half-maximum of each curve shows that multiple wire populations with small deviations from the vertical exist within the PDMS films indicating a greater spread than that observed for the single crystal wafer. FIG. 10C is a phi scan which shows six degenerate {220} reflections of the Si lattice, indicating that no axial rotation existed between wires in the PDMS film, i.e., excellent wire rotational symmetry. The difference in peak heights as a function of rotation angle resulted from the x-ray beam passing through different percentages of Si wires and PDMS at each {220} reflection.

Figure 11:
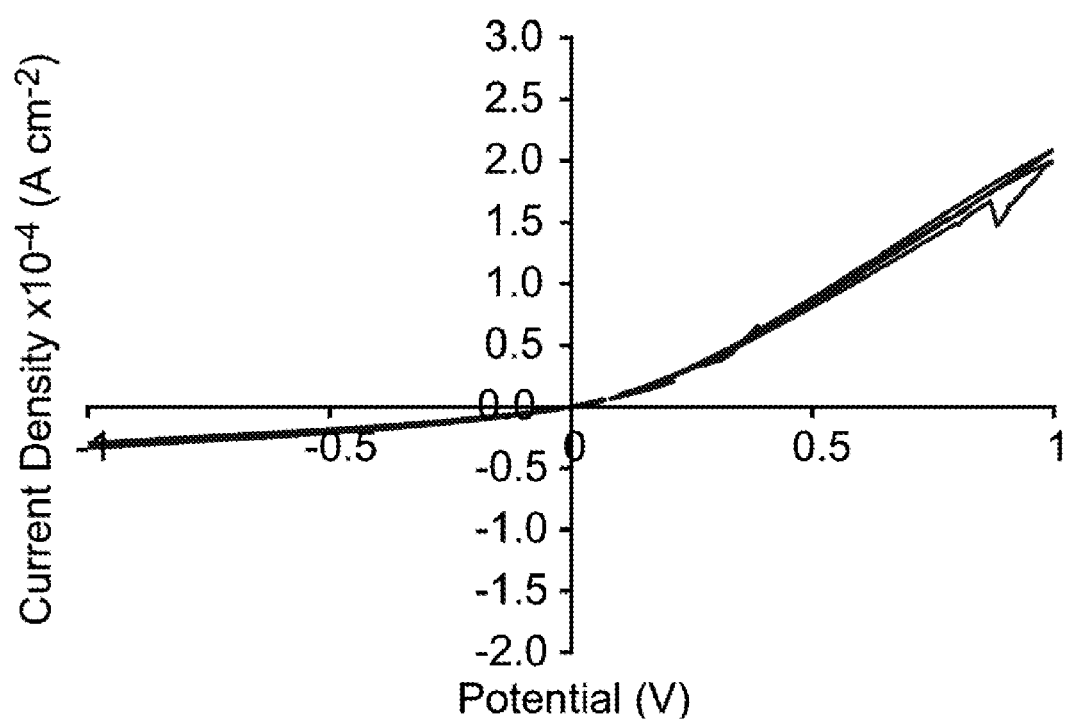
FIG. 11 shows J-V characteristics of an Au catalyst-suspended Si wire array Schottky diode fabricated using embedded rod arrays.

Embodiments of the present invention may be used for the fabrication of solar cell devices. In accordance with embodiments of the present invention, rod-array based Schottky diodes were prepared from polymer-embedded Si wire array films, where the Si wire arrays had been constructed from single crystalline Si wafer as described above. The wire array film was affixed to a piece of electrically insulating tape with a 0.40 cm diameter circular hole. Of the VLS catalyst metals used to date, Au may yield the highest barrier height with n-type Si. When Au is used as the VLS catalyst, hemispheres of the metal remained on the top of each Si wire. Conducting polymer, Poly(3,4-ethylenedioxythiophene):poly(styrenesulfonate) (PEDOT:PSS) (Baytron P, 1:1 v:v solution with ethanol, 20 µL), was drop-cast into the exposed area of the film to provide electrical contact to the metal tips. After the application of the conducting polymer, the structure was heated to 150° C. to form a thin film that did not penetrate between the wires, but was instead suspended on the tops of the wires. The bottom side of the wire array film (i.e., the side of the film that originally was facing the Si substrate) was etched in buffered HF (Transene) for about 30 seconds, and then Ga:In eutectic was applied and sandwiched between the film and a stainless steel substrate. Electrical contact was made between the stainless steel and silver epoxy in contact with the PEDOT:PSS layer. The resulting device exhibited rectifying behavior, as expected for a contact between n-type Si and Au, albeit with a low barrier height when compared to that expected for a well-controlled junction. FIG. 11 shows J-V characteristics of the Au catalyst-suspended Si wire array Schottky diode described above. This device represents a worst-case scenario because mid-gap Au impurities exist near equilibrium concentrations in the wire bulk, junctions were formed only on the ends of the wire (i.e., not radially), and the wire surfaces were not explicitly passivated. In addition, the Au—Si junction was formed during wire growth at temperatures near 1000° C., which is expected to lead to non-ideal diode characteristics. Nevertheless, current was passed through the embedded Si wires, demonstrating that electrical contact to either end of the polymer-suspended wires is feasible.

The optical properties of the embedded rod arrays provided by embodiments of the present invention are also of note. PDMS is typically greater than 95% transparent between 300 and 1000 nm, however, the rod array-polymer composites are highly light absorbing and/or scattering as shown in FIG. 9, even though the top-down density of Si wires was less than 6.5% of the projected area of the film. The optical properties of structures provided by embodiments of the present invention, particularly their light trapping properties, may provide additional advantages over structures and methods currently known in the art. In addition, alternative embodiments may chemically or thermally shrinking the binder material layer with the embedded rods, such that the embedded rod arrays may be made denser without requiring wires to be packed closely during the patterned growth step. Such a densification process would represent a means of improving the light absorption properties even further.

Embodiments of the present invention provide for the transfer of single-crystalline inorganic wires arrays onto a variety of substrates while preserving the orientation of the wires normal to the plane of the substrate. Such embodiments arrange and preserve the organization of Si wires over macroscopic areas to allow for preparation of solar cell materials that have oriented, single-crystal, inorganic absorbers, which can be prepared by high-temperature processing then transformed into a flexible, processable form factor. These embodiments also enable inclusion of such wire-array structures in applications such as nanoelectronics and nanophotonics, where ordered, extended three-dimensional structures of nanoscale devices are desired on the macroscale.

Embodiments of the present invention provide for the incorporation and embedding of other semiconductor structures along with rod arrays in a binder material layer and the removal of that layer from a substrate. That is, one portion of the substrate may be used to form semiconductor rod arrays while other portions of the substrate may be used to form other semiconductor structures, such as p-n junctions, transistors, etc., or semiconductor contacts or junctions. The binder material may then be applied to encapsulate or partially encapsulate all of the structures on the substrate. The binder material layer may then be separated from the substrate to provide a film with semiconductor rod arrays and other semiconductor structures. These other semiconductor structures may provide electrical and/or structural contacts to the semiconductor arrays or additional processing steps (such as those described above) may be used to provide desired electrical and/or structural contacts.

Embodiments of the present invention create free-standing rod array membranes. Embodiments of the present invention include rod arrays consisting of any solid material, including but not limited to, silicon radial or axial junction rods, $CdSe_x$-$Te_{x-1}$, and Ge/Si heterojunctions. Embodiments of the present invention are not limited to PDMS polymer as the binder material for filling interrod gaps. Other binder material may include: insulating polymer materials, such as polyethylene-vinyl acetate copolymer; a heat-shrinkable material, or a material covalently grown from the rods. Additionally, as described above, conductive polymers may be employed to provide electrical contact.

Further, the density of the structures within the binder material layer are not limited to the original density (i.e., individual spacings) of the structures obtained when the structures are transferred to the binder material layer. Post processing may be used to shrink the binder material layer and therefore increase the density. Shrinkage may be accomplished by further evaporating a solvent from the binder material layer or heating the binder material or using other techniques. Other processing may be used to decrease the density of structures by swelling the binder material layer, by, for example, adding a solvent. Such post processing allows the ability to alter the density of the structures while still maintaining the overall ordering and relationship of the structures to one another.

Manipulation of the density of the structures in the binder material layer may be particularly for optical apparatus according to embodiments of the present invention. As discussed above with regard to FIG. 9, arrays of semiconductor structures embedded in a binder material layer may have certain optical characteristics. Increasing or decreasing the density of those structures provides the ability to modify those optical characteristics.

Those skilled in the art will understand that embodiments of the present invention may provide utility in a number of applications. Embodiments of the present invention provide the ability to form electrical contacts to arrays of embedded semiconductor structures in a number of ways. Other semiconductor structures may be embedded along with the semiconductor structure arrays, therefore providing the ability to construct very complex electronic devices using the connectivity and structural flexibility provided by these embodiments. Such devices may comprise transistors, diodes, and optically active structures and even more complex structures. Such structures may find application in sensors and other complex electronics systems.

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . "

What is claimed is:

1. A structure comprising:
a binder material layer; and
an ordered array of spaced apart semiconductor structures, wherein each one of the semiconductor structures has a length dimension and wherein the semiconductor structures are conformably constrained along at least a portion of the length dimension of each semiconductor structure within the binder material layer, wherein the diameter of the semiconductor structure is about 1.5 µm to 50 µm and the aspect ratio is greater than 1.

2. The structure according to claim 1, wherein semiconductor structures are fabricated separately from the binder material layer and are transferred into the binder material layer and wherein the binder material layer maintains the ordering and spacing obtained from the initial fabrication of the semiconductor structures.

3. The structure according to claim 2, wherein the semiconductor structures are fabricated with shapes with high aspect ratios, wherein the high aspect ratios define orientations among the semiconductor structures and the binder material layer maintains the orientations of the semiconductor structures upon transfer of the semiconductor structures into the binder material layer.

4. The structure according to claim 1, wherein semiconductor structures are fabricated separately from the binder material layer with an order and spacing and are transferred into the binder material layer and wherein the binder material layer is manipulated to modify the order and/or spacing of the semiconductor structures within the binder material layer.

5. The structure according to claim 4, wherein the semiconductor structures are fabricated with an order and spacing to provide a first density for the semiconductor structures and the binder material layer is manipulated to provide a second density for the semiconductor structures.

6. The structure according to claim 5, wherein the second density is chosen for desired optical properties for the structure.

7. The structure according to claim 1, further comprising an electrically contactive layer, wherein the electrically contactive layer contacts one or more of the semiconductor structures at or near ends of the semiconductor structures.

8. The structure according to claim 1, wherein binder material layer comprises a flexible material.

9. The structure according to claim 1, wherein the binder material layer comprises one or more of the following materials: conducting polymer material, insulating polymer material; heat-shrinkable material; and material covalently grown from the semiconductor structures.

10. The structure according to claim 1, further comprising additional non-ordered semiconductor structures embedded within the binder material layer and electrical contacts to the additional non-ordered semiconductor structures.

* * * * *